United States Patent [19]

Raaijmakers

[11] Patent Number: 5,725,740
[45] Date of Patent: Mar. 10, 1998

[54] ADHESION LAYER FOR TUNGSTEN DEPOSITION

[75] Inventor: Ivo Raaijmakers, San Jose, Calif.

[73] Assignee: Applied Materials, Inc., Santa Clara, Calif.

[21] Appl. No.: 482,682

[22] Filed: Jun. 7, 1995

[51] Int. Cl.$^6$ .................................................. C23C 14/34
[52] U.S. Cl. .............................. 204/192.12; 204/192.15; 204/192.17
[58] Field of Search .......................... 204/192.12, 192.15, 204/192.17

[56] References Cited

U.S. PATENT DOCUMENTS

| | | | |
|---|---|---|---|
| 4,160,690 | 7/1979 | Shibagaki et al. | 204/298.38 X |
| 4,664,747 | 5/1987 | Sekiguchi et al. | 204/298.38 X |
| 4,844,775 | 7/1989 | Keeble | 204/298.34 X |
| 5,202,008 | 4/1993 | Talieh et al. | 204/192.32 |
| 5,427,666 | 6/1995 | Mueller et al. | 204/192.12 X |
| 5,439,574 | 8/1995 | Kobayashi et al. | 204/192.12 |

FOREIGN PATENT DOCUMENTS

| | | | |
|---|---|---|---|
| 57-152127 | 9/1982 | Japan | H01L 21/28 |
| 63-162573 | 7/1988 | Japan | C04B 35/58 |

OTHER PUBLICATIONS

Schmitz, Chap. II "The Blanket Tungsten Approach", Chemical Vapor Deposition of Tungsten and Tungsten Silicides, Noyes Publications, pp. 10–19.

*Primary Examiner*—Nam Nguyen
*Attorney, Agent, or Firm*—Birgit E. Morris; Donald Verplancken

[57] ABSTRACT

A method of removing free titanium from the edge of a substrate having a layer of titanium and a layer of titanium nitride thereover by forming a plasma of a nitrogen-containing gas. The plasma reacts with exposed free titanium to form titanium nitride therefrom. Preferably the dual Ti/TiN depositions and the plasma treatment are all carried out in the same chamber.

13 Claims, 3 Drawing Sheets

ADHESION LAYER FOR TUNGSTEN DEPOSITION

This invention relates to an improved blanket tungsten plug formation process. More particularly, this invention relates to treatment of an underlying adhesion layer prior to tungsten deposition.

BACKGROUND OF THE INVENTION

Tungsten is deposited as a contact layer by chemical vapor deposition (CVD) from tungsten hexafluoride, $WF_6$. Since tungsten does not adhere well to dielectric materials such as silicon oxide or silicon nitride, an adhesion layer is deposited first to ensure good adhesion between the tungsten and the substrate. After deposition, the tungsten and the adhesion layer are generally etched back to the level of the dielectric layer.

FIG. 1 illustrates the three step, so-called blanket tungsten deposition process. FIG. 1A shows a silicon substrate 12, a dielectric layer 14, such as silicon oxide which has been patterned to form a contact opening 16. An adhesion layer 18 is deposited conformally over the opening 16 and the dielectric layer 14. FIG. 1B shows that after blanket deposition of a tungsten layer 20, the tungsten 20 fills the opening 16 and extends over the adhesion layer 18 and the dielectric layer 14. FIG. 1C shows that after etch back of the tungsten layer 20 and the adhesion layer 18 to the level of the dielectric layer 14, the dielectric layer 14 is exposed again and the opening 16 is filled with tungsten 20. The adhesion layer 18 is removed from the dielectric layer 14 during the etch back process, but remains between the substrate 12 and the tungsten layer 20.

The presence of the adhesion layer permits tungsten deposition over all types of substrates, including dielectric layers such as silicon oxide, or conductive layers of silicon, aluminum, titanium, silicides and the like. The adhesion layer is generally deposited by sputtering or by chemical vapor deposition.

A good adhesion layer must satisfy the following criteria; it must provide good adhesion to the substrate and to tungsten; it must be compatible with tungsten deposition chemistry, i.e., it must not react with the fluorine-containing tungsten deposition chemistry, nor should fluorine contaminant species be able to diffuse through the adhesion layer to react with underlying layers; it must have an acceptable contact resistance; it must provide reasonable step coverage; and it must be able to be made by a low defect, manufacturable process.

It is known that barrier layers such as titanium nitride (TiN), and titanium tungsten (TiW), make good adhesion layers for tungsten. These materials are widely used to improve contact resistance and contact reliability for aluminum contacts, and serve the same purpose for tungsten contacts as well.

Several methods have been used to deposit TiN as a tungsten adhesion layer. Sputtered TiN has good adhesion and barrier properties, is well characterized and is used as the TiN deposition method of choice in current day production. However, because the electrical contact resistance between TiN and underlying layers is not very good, generally a first, thin Ti layer is deposited by sputtering prior to the deposition of the adhesion layer. However, this initial titanium layer may not be totally covered at the edge of the substrate, particularly when clamping rings are used in a sequential step to press the substrate against its support during processing, e.g., during the deposition of TiN. Titanium may also be exposed at the bevel of the wafer.

FIG. 2 illustrates an exposed titanium layer 18' at the edge of a substrate 12 onto which titanium 18' and titanium nitride 18" have been sputter deposited in the same chamber. In particular titanium 18' deposits under a clamping ring 116 used to clamp the wafer to a temperature controlled chuck. The clamping ring shields the edge of the substrate 12 from sputter deposition. The exposed titanium will react with $WF_6$ during the tungsten deposition step, forming $TiF_x$, which causes a loss of adhesion, and consequently particles deposit on the substrate 12. Thus a way to eliminate exposed titanium at or near the edge of the substrate 12 must be found prior to depositing CVD tungsten.

SUMMARY OF THE INVENTION

I have found that after sputter deposition of a Ti/TiN layer, exposed titanium at or near the edge of a substrate such as a semiconductor wafer can be eliminated by exposing the free titanium to a plasma of a nitrogen-containing gas, preferably in the same chamber in which the materials are sputtered. A plasma can be formed for example by fitting a conventional sputter deposition chamber with a source of RF power to the substrate support pedestal. When a nitrogen-containing gas is flowed into the chamber and the RF power is turned on, a plasma of the nitrogen-containing gases is formed near the substrate. A nitrogen plasma can also be generated inductively with an RF power source placed around the plasma region. Alternately, a nitrogen-containing plasma can be formed in a remote chamber, as in a microwave chamber or ECR chamber, and the plasma passed into the sputtering chamber. The nitrogen-containing plasma readily reacts with free titanium, forming TiN.

DETAILED DESCRIPTION OF THE INVENTION

Figure 1A:
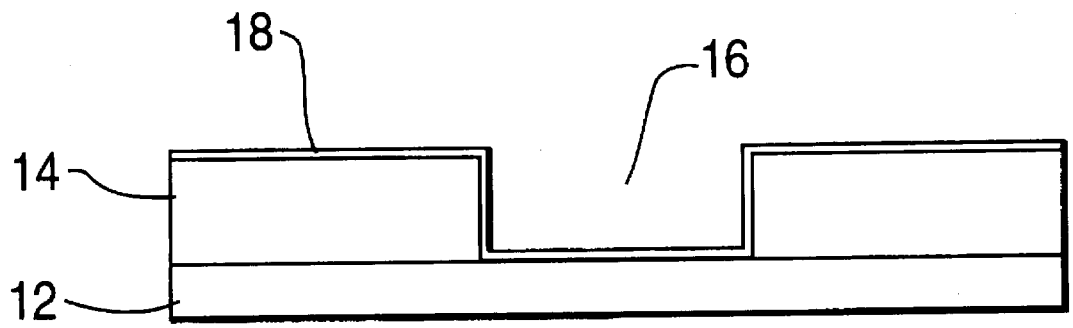
FIGS. 1A, 1B and 1C illustrate the three step tungsten deposition process.
Figure 1B:
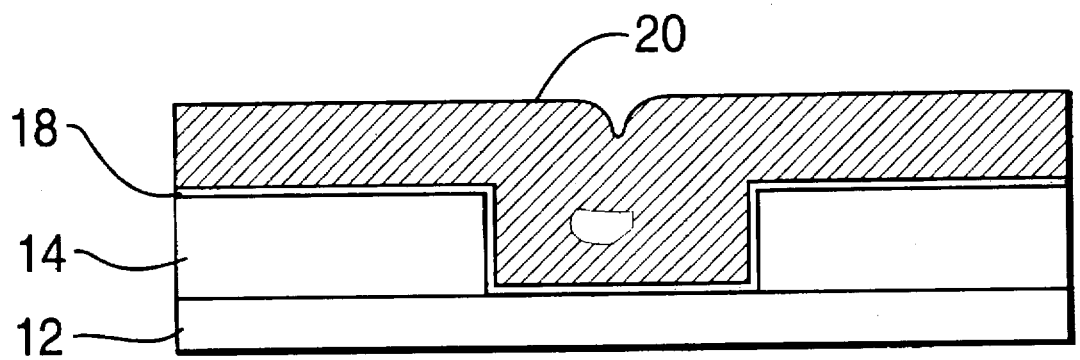
Figure 1C:
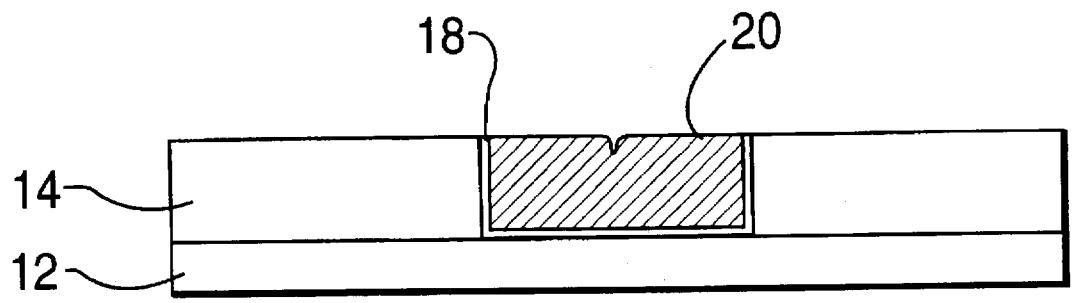
Figure 2:
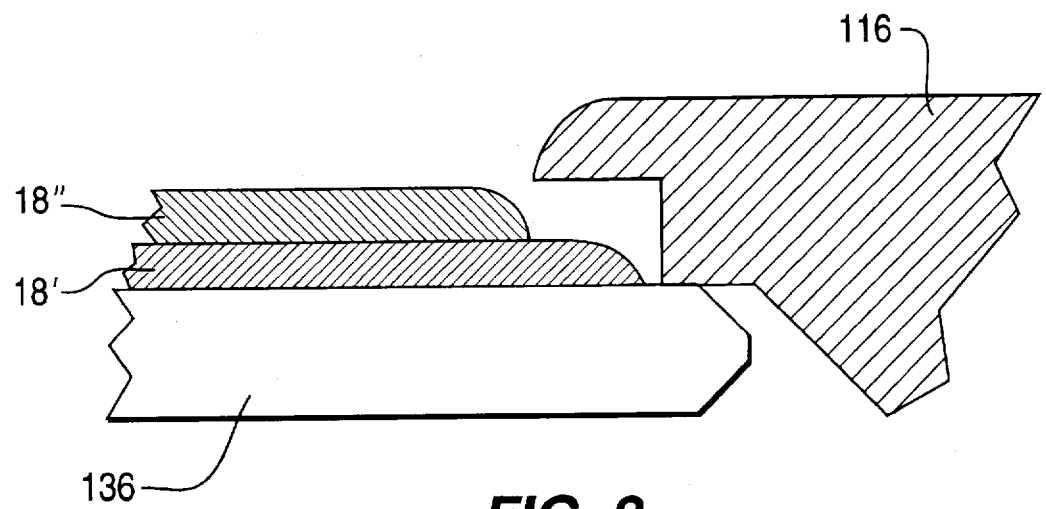
FIG. 2 illustrates a substrate having a titanium/titanium nitride bilayer thereon wherein some titanium is exposed.
Figure 3:
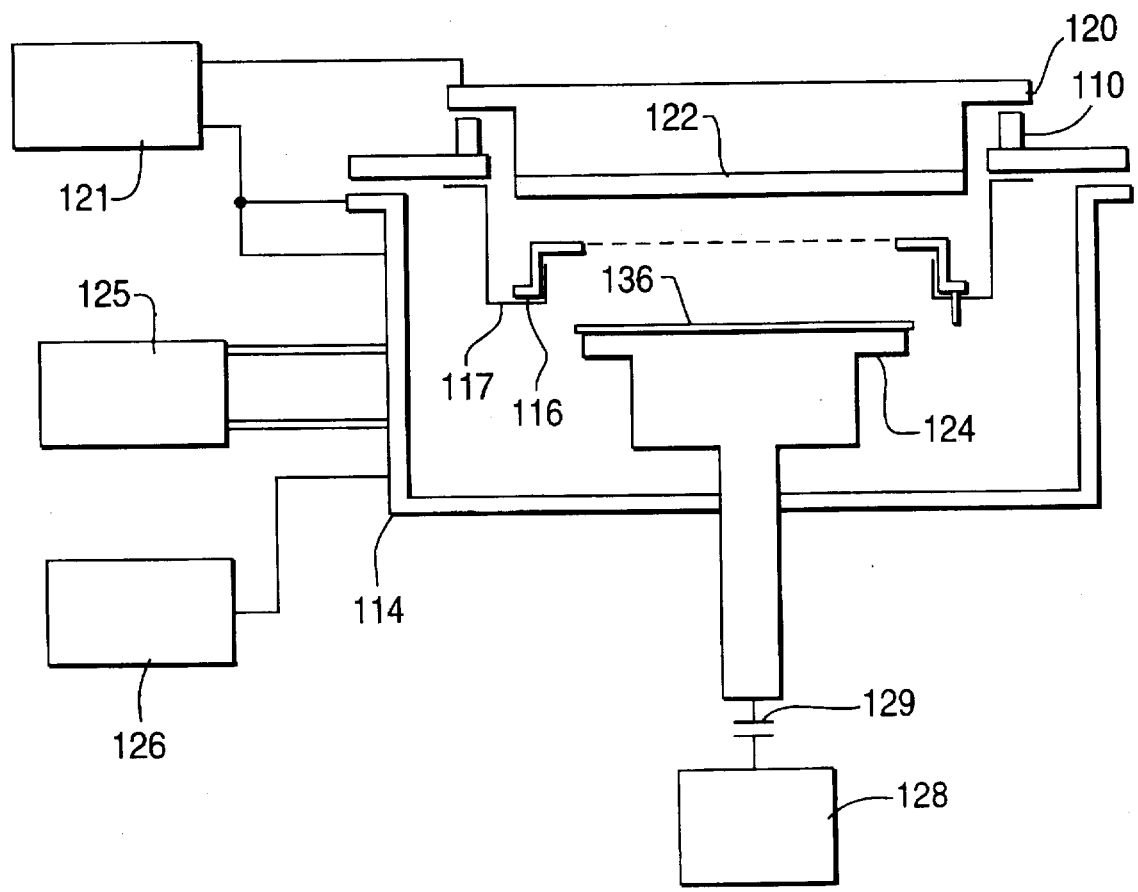
FIG. 3 is a cross sectional view of a sputtering vacuum chamber in which the present process may be carried out.

In order to eliminate free exposed titanium from a substrate having sputtered Ti/TiN layers thereon, a modified sputter deposition chamber can be used as shown in FIG. 3.

FIG. 3 illustrates a physical vapor deposition (PVD) chamber 114 including a vertically movable substrate support 124. During the course of processing a substrate, such as a wafer 136, the wafer 136 is placed on the substrate support 124. The substrate support 124 is raised through a shield 117 lifting a clamping ring 116 to a processing position, shown in dotted line. Gas control circuitry 126 provides gas flow control into the chamber 114. A vacuum pump 125 is used to create a vacuum in the chamber 114 during processing of a wafer 136.

A source 120 has a sputter target 122 composed of, for example, titanium. The source 120 is electrically isolated from the shield 117 and the rest of the PVD chamber 114 by an insulator ring 110. A DC power supply 121 establishes a voltage potential between the shield 117 and the source 120. When sputter deposition is taking place, the negative terminal of the DC power supply 121 is connected to the target 122. The positive terminal is grounded to the PVD chamber 114. This operating mode is used because gaseous ions, such as argon, will be accelerated toward the surface connected to the negative terminal of the power supply 121. Thus ions in the deposition plasma strike the target 122 and cause sputtering of the target material onto the wafer 136 on the support 124. Thus a titanium layer is formed on the wafer. Either in the same or in a second, similar sputtering chamber, a thin TiN film can be formed on the wafer by reactive sputtering of Ti in an argon/nitrogen ambient. Due to non-perfect alignment of the wafer, or due to the effect of the clamping ring, this will result in exposure of Ti at the edge regions of the wafer.

Figure 4:
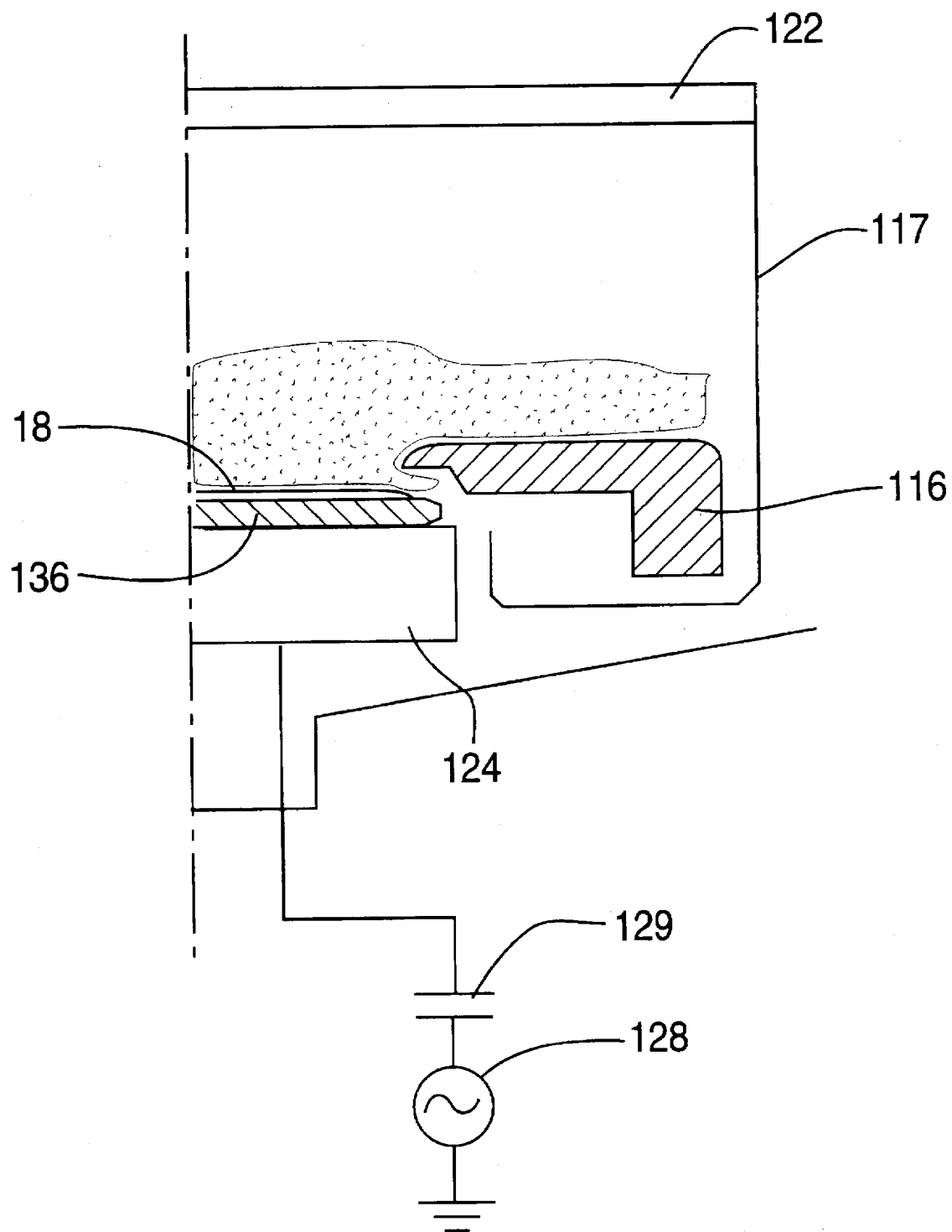
FIG. 4 is a cross sectional view of one embodiment of the relative positions of the substrate support and the clamping ring of the chamber of FIG. 3 during a plasma treatment step.

In order to subsequently eliminate free exposed titanium from the substrate in the same chamber, an RF power supply 128 generates a power signal of, e.g., 13.56 MHz, which is connected through a capacitor 129 to the cathode support 124. The support 124 is preferably lowered slightly so as to provide a spacing between the wafer 136 and the clamping ring 116, to provide insulation between the clamping ring 116 and the wafer 136, and to permit ready access of the generated plasma to the exposed titanium 18'. FIG. 4 illustrates the relative position of the clamping ring 116 and the substrate 136 and substrate support 124 during the plasma treatment step. A nitrogen-containing gas flow is begun, and RF power is applied to the electrode support 124. A nitrogen-containing plasma forms in the area just above the wafer 136, and reacts with any exposed titanium 18' to form TiN.

When the space between the clamping ring 116 and the shield 117 is less than the dark space width of the plasma, the plasma is not generated between these surfaces, and the plasma must extend to the free titanium 18' by diffusion. However, if the space between the clamping ring 116 and the shield 117 is greater than the dark space width of the plasma, the plasma will extend to the edge of the substrate where free titanium 18' is most likely to be found.

Thus the preferred deposition and treatment of the adhesion layer of the invention comprises the following steps:

a) sputter depositing a conformal layer of Ti/TiN over a patterned semiconductor substrate;

b) admit a nitrogen-containing precursor gas to the chamber;

c) supply RF power to the support, thereby forming a nitrogen-containing plasma that will react with any exposed titanium to form TiN.

In a most preferred embodiment, the semiconductor substrate support is lowered prior to forming the plasma so that the clamping ring does not touch the substrate during the plasma treatment step.

Suitable nitrogen-containing plasma precursor gases include nitrogen, $N_2$, ammonia, $NH_3$, hydrazine, $N_2H_2$, and the like. A carrier gas, which can be a noble gas such as argon, can also be simultaneously flowed into the chamber.

The Ti and TiN can be deposited in the same or in separate chambers, but the use of a single chamber to deposit both Ti and TiN layers can improve throughput and is preferred. Thus preferably, both Ti and TiN are deposited in the same chamber and the plasma treatment step is also carried out in the same chamber. Similarly, the plasma treatment step to eliminate exposed Ti can be carried out in a separate chamber, but again at the expense of throughput and cost. Thus preferably, both Ti and TiN are deposited in the same sputtering chamber and plasma treatment is also carried out in the same chamber. However, if found convenient, the substrate can be removed to a separate plasma treatment chamber. Alternately, the plasma may be remotely generated, as from a microwave source chamber that can produce long lived active species such as $NH_2*$ or $N_2*$, which can be passed into the sputtering chamber or into the separate plasma treatment chamber.

When the same chamber is employed for both sputter deposition and plasma generation, the bias voltage should be kept low, e.g., less than 100 volts, and preferably less than 50 volts, to avoid sputtering of Ti/TiN onto the substrate surface or onto the clamping ring during the plasma treatment step.

When a sputtering chamber as in FIG. 3 is employed, which uses a clamping ring to shield the substrate, exposed Ti 18' generally is found under the clamping ring 116. However, even if a clamping ring is not used, some Ti may be exposed at the edge of the substrate, which can cause particles to form during the blanket tungsten deposition step.

In the case where a collimator is used in the sputtering chamber to improve directionality of the sputtered material, some Ti still may be found at the edge of the substrate.

In a preferred sputtering process, Ti is first sputtered in argon using a pressure of about 2 millitorr and 3 kw of power. A second TiN layer is sputtered in an atmosphere of argon and nitrogen at a total pressure of about 4 millitorr and a power of about 10 kilowatts. Under these conditions about 1000 Å/min of Ti-containing material is deposited. In general, a layer of about 200 Å of Ti and about 500 Å of TiN are deposited to form an adhesion layer for an overlying tungsten layer.

It is preferred to deposit both Ti and TiN in the same chamber. However, the use of dual sputtering chambers does not eliminate exposed Ti, because of misalignment problems of the substrate, which must be placed on two different substrate supports, and the use of two clamping rings in the two chambers. Since the two clamping rings may not be of the exact same size, the dual chambers in fact may make the problems of exposed Ti even worse than when only a single sputtering chamber is used. Further, since the clamping rings in the dual chamber configuration must be sized to accommodate misalignment problems, the clamping rings must be made so that they shield a larger region on the edge of the wafer, thereby reducing the total surface of the substrate that is available to make devices.

In an alternative configuration, an inductive coil can be placed along the walls of the sputtering chamber to form a plasma inductively during the plasma treatment step. All that is required is a means of providing reactive nitrogen-containing species to react with free Ti.

Although the present invention has been described in terms of certain equipment and process steps, one skilled in the art will know that various alternative equipment and process steps may be equivalent and can be substituted. The invention is only meant to be limited by the appended claims.

I claim:

1. A method of eliminating free exposed titanium from an edge of a substrate having sequentially sputtered layers of titanium and titanium nitride thereon, wherein a portion of said substrate was masked by a clamping ring during sputter deposition so that free titanium remains, comprising a) mounting the substrate on a substrate support in a processing chamber, and b) exposing the free exposed titanium on the substrate to a nitrogen-containing plasma to form TiN from the exposed titanium.

2. A method according to claim 1 wherein said plasma is generated by passing a flow of nitrogen-containing gas to the processing chamber fitted with source of RF power and igniting a plasma of said gas.

3. A method according to claim 2 wherein said nitrogen-containing gas includes a member selected from the group consisting of nitrogen, ammonia and hydrazine.

4. A method according to claim 1 wherein both titanium and titanium nitride are sputter deposited on the substrate in the same sputtering chamber.

5. A method according to claim 4 wherein the nitrogen plasma treatment step is carried out in the same sputtering chamber.

6. A method according to claim 5 wherein the nitrogen plasma is generated by applying RF power to the substrate support.

7. A method according to claim 5 wherein the nitrogen plasma is generated by applying RF power to a coil surrounding the plasma region of the chamber.

8. A method according to claim 7 wherein said remote plasma chamber is an ECR chamber.

9. A method according to claim 7 wherein said remote plasma chamber is a microwave chamber.

10. A method according to claim 1 wherein a plasma is generated in a remote plasma chamber and then passed into the sputtering chamber.

11. A method according to claim 1 wherein prior to exposure of the substrate to a plasma, the substrate is lowered to provide a space between the substrate and the clamping ring supported in said chamber.

12. A method of eliminating free exposed titanium from an edge of a substrate having sequentially deposited layers of titanium and titanium nitride thereon, wherein a portion of said substrate was masked by a clamping ring during deposition so that free titanium remains, comprising:

a) mounting the substrate on a substrate support in a sputtering chamber fitted with RF generating means connected to said substrate support;

b) providing a flow of nitrogen-containing gas to said chamber; and c) igniting a plasma from said nitrogen-containing gas by turning on the RF power supply, thereby forming activated nitrogen species that reacts with any exposed titanium to form titanium nitride.

13. A method according to claim 12 wherein prior to said plasma treatment, the substrate support is lowered to provide a space between the substrate and the overlying clamping ring.

* * * * *